United States Patent
Kim et al.

(10) Patent No.: US 7,177,135 B2
(45) Date of Patent: Feb. 13, 2007

(54) ON-CHIP BYPASS CAPACITOR AND METHOD OF MANUFACTURING THE SAME

(75) Inventors: Daehwan Kim, Hwasung (KR); Junghwa Lee, Hwasung (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/864,509

(22) Filed: Jun. 10, 2004

(65) Prior Publication Data

US 2005/0063134 A1  Mar. 24, 2005

(30) Foreign Application Priority Data

Sep. 24, 2003  (KR) .................. 10-2003-0066397

(51) Int. Cl.
  *H01G 4/00* (2006.01)
(52) U.S. Cl. ............ 361/301.2; 361/301.1; 361/306.2; 361/303; 361/328; 365/102; 365/149; 365/220; 365/221
(58) Field of Classification Search .. 361/301.1–301.4, 361/302, 303, 306.1, 306.3, 328, 321.1–321.5; 365/102, 149, 220–221, 230.3; 327/538, 327/540
See application file for complete search history.

(56) References Cited

U.S. PATENT DOCUMENTS

| | | | | |
|---|---|---|---|---|
| 4,392,210 A | * | 7/1983 | Chan | 365/149 |
| 5,321,648 A | * | 6/1994 | Dennison et al. | 365/149 |
| 5,371,701 A | * | 12/1994 | Lee et al. | 365/149 |
| 5,410,504 A | * | 4/1995 | Ward | 365/149 |
| 5,943,276 A | * | 8/1999 | Casper | 365/149 |
| 6,124,163 A | | 9/2000 | Shirley et al. | |
| 6,265,742 B1 | * | 7/2001 | Gruening et al. | 257/304 |
| 6,429,730 B2 | * | 8/2002 | Houghton et al. | 365/149 |
| 6,519,132 B1 | * | 2/2003 | Liu | 361/301.1 |
| 2004/0108587 A1 | * | 6/2004 | Chudzik et al. | 257/700 |

FOREIGN PATENT DOCUMENTS

KR  1998-035297  8/1998

* cited by examiner

*Primary Examiner*—Nguyen T. Ha
(74) *Attorney, Agent, or Firm*—Harness, Dickey & Pierce, P.L.C.

(57) ABSTRACT

An on-chip bypass capacitor and method of manufacturing the same, the on-chip bypass capacitor including at least two capacitor arrays, each capacitor array including a first layer connecting the at least two capacitor arrays in series, each capacitor array including a plurality of capacitors, each of the plurality of capacitors including a second layer connecting the plurality of capacitors in parallel. The on-chip bypass capacitor may be part of a chip which also includes a memory cell array including at least one cell capacitor.

24 Claims, 10 Drawing Sheets

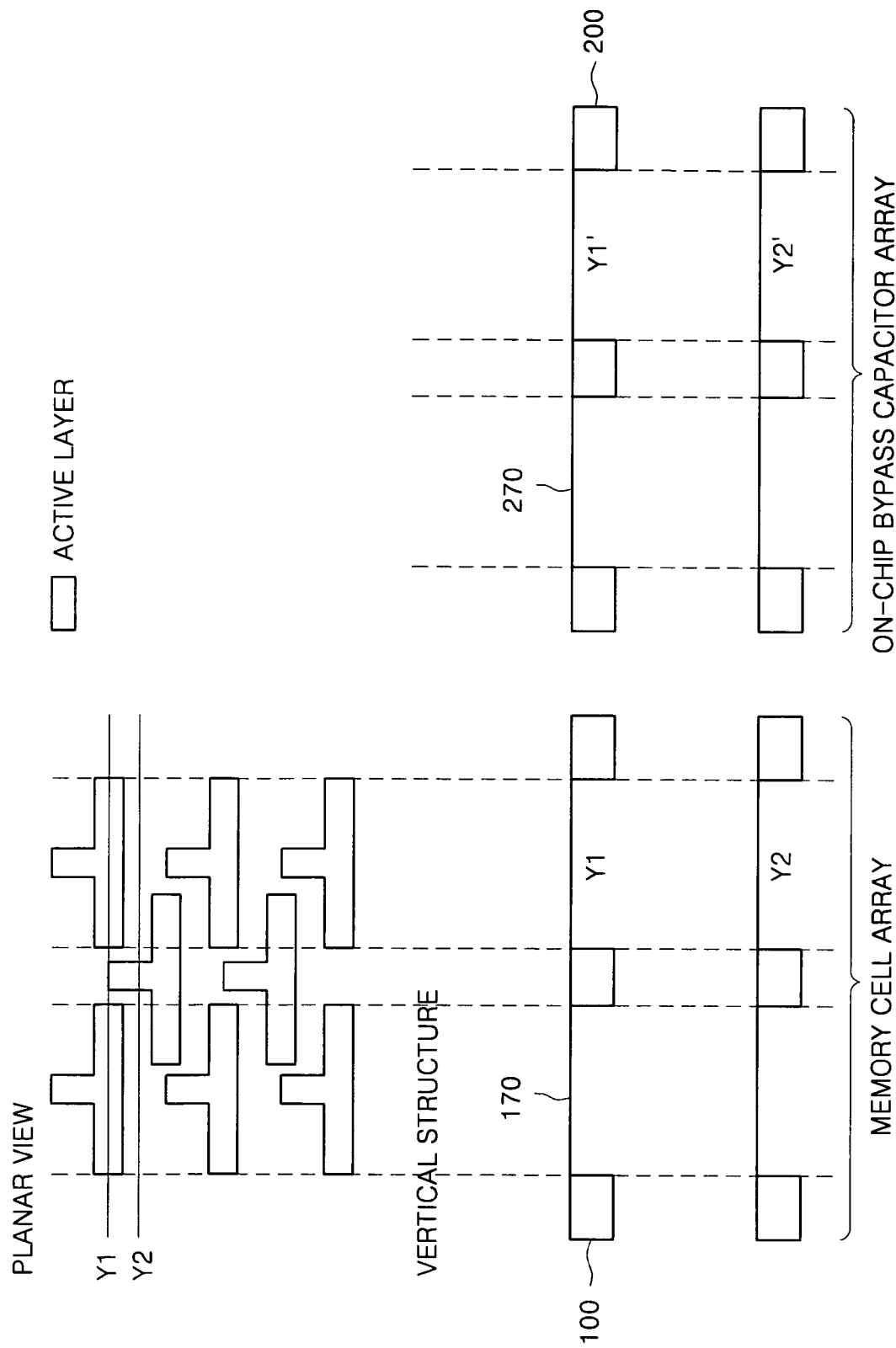

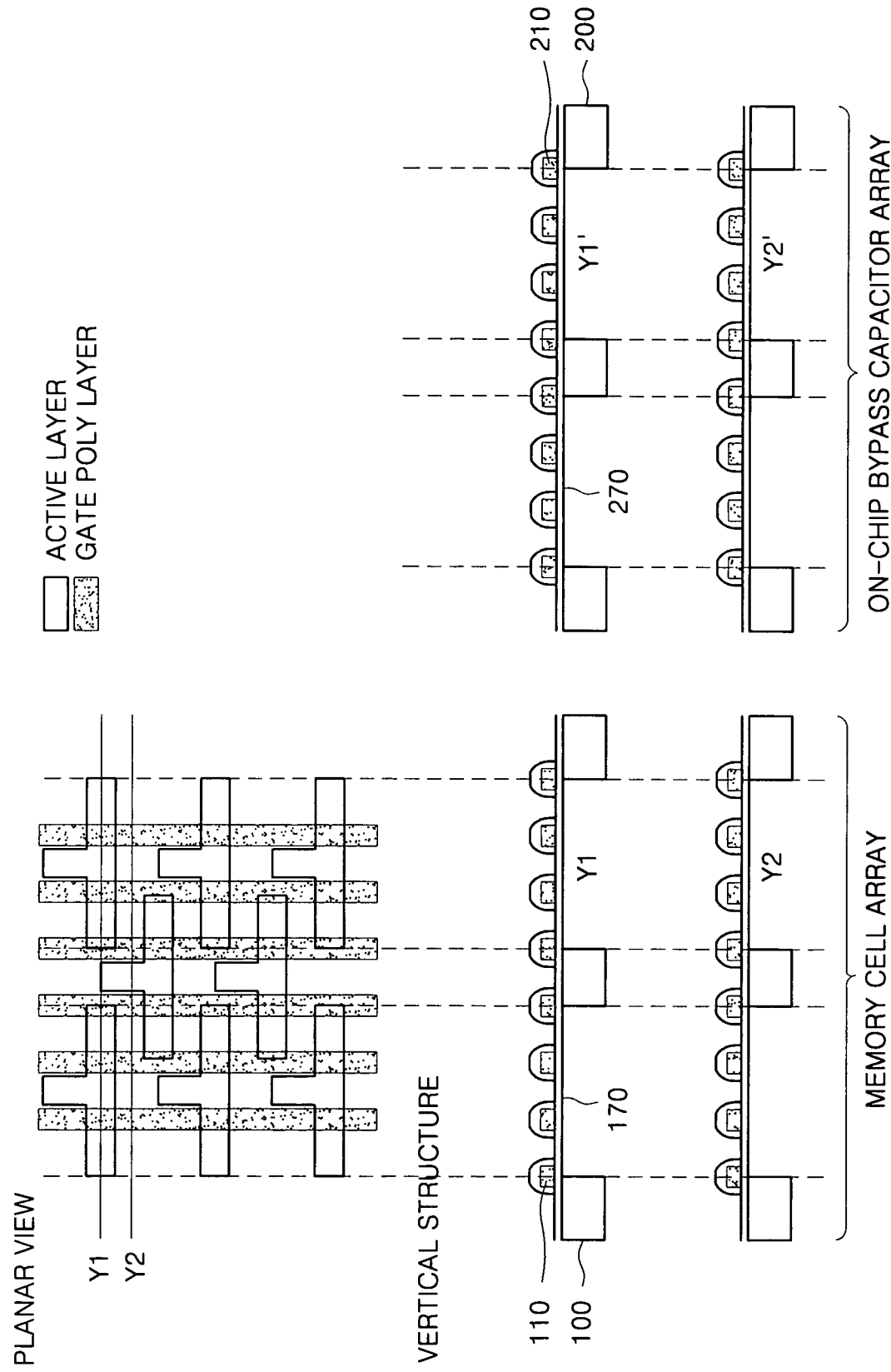

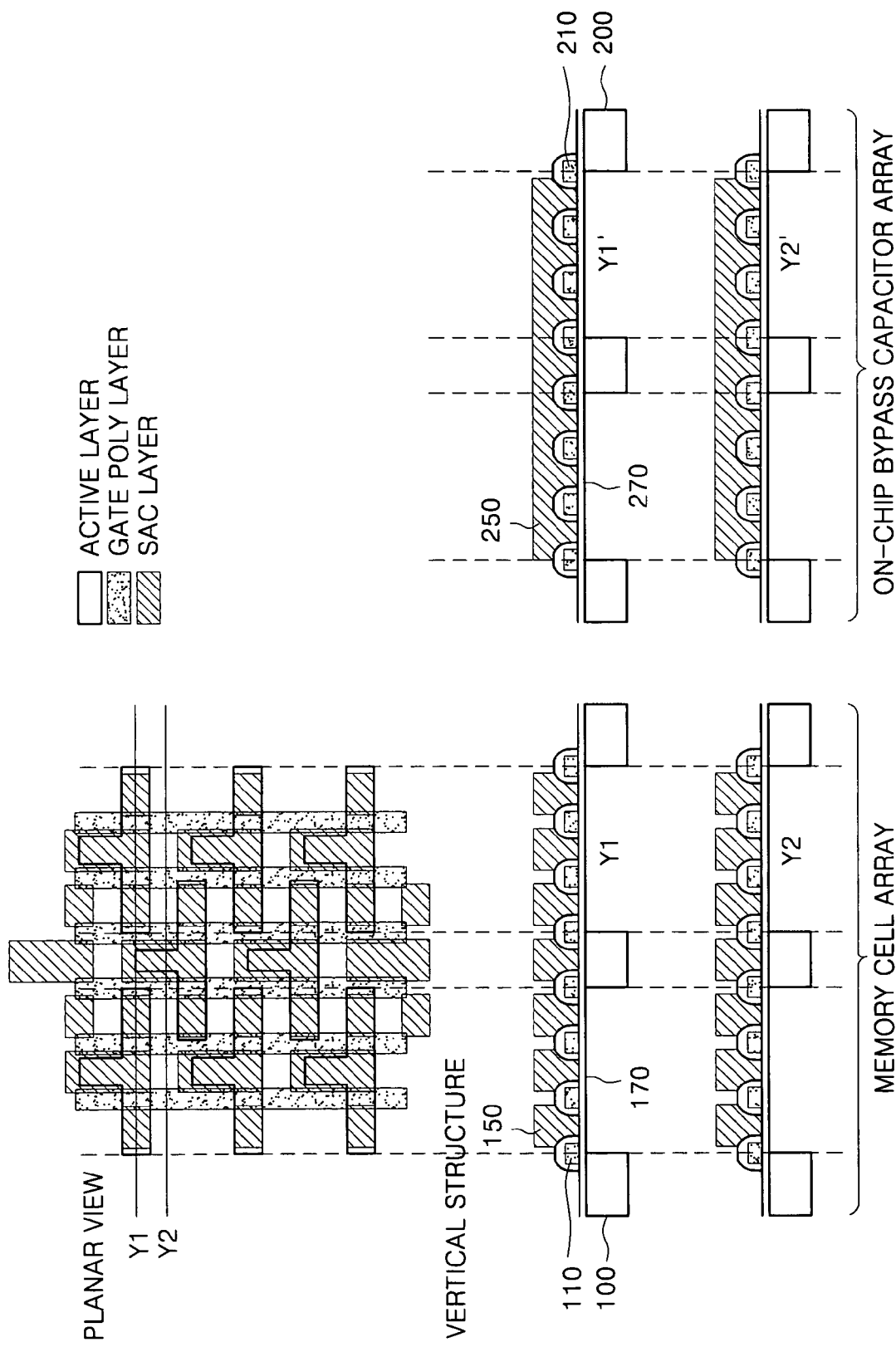

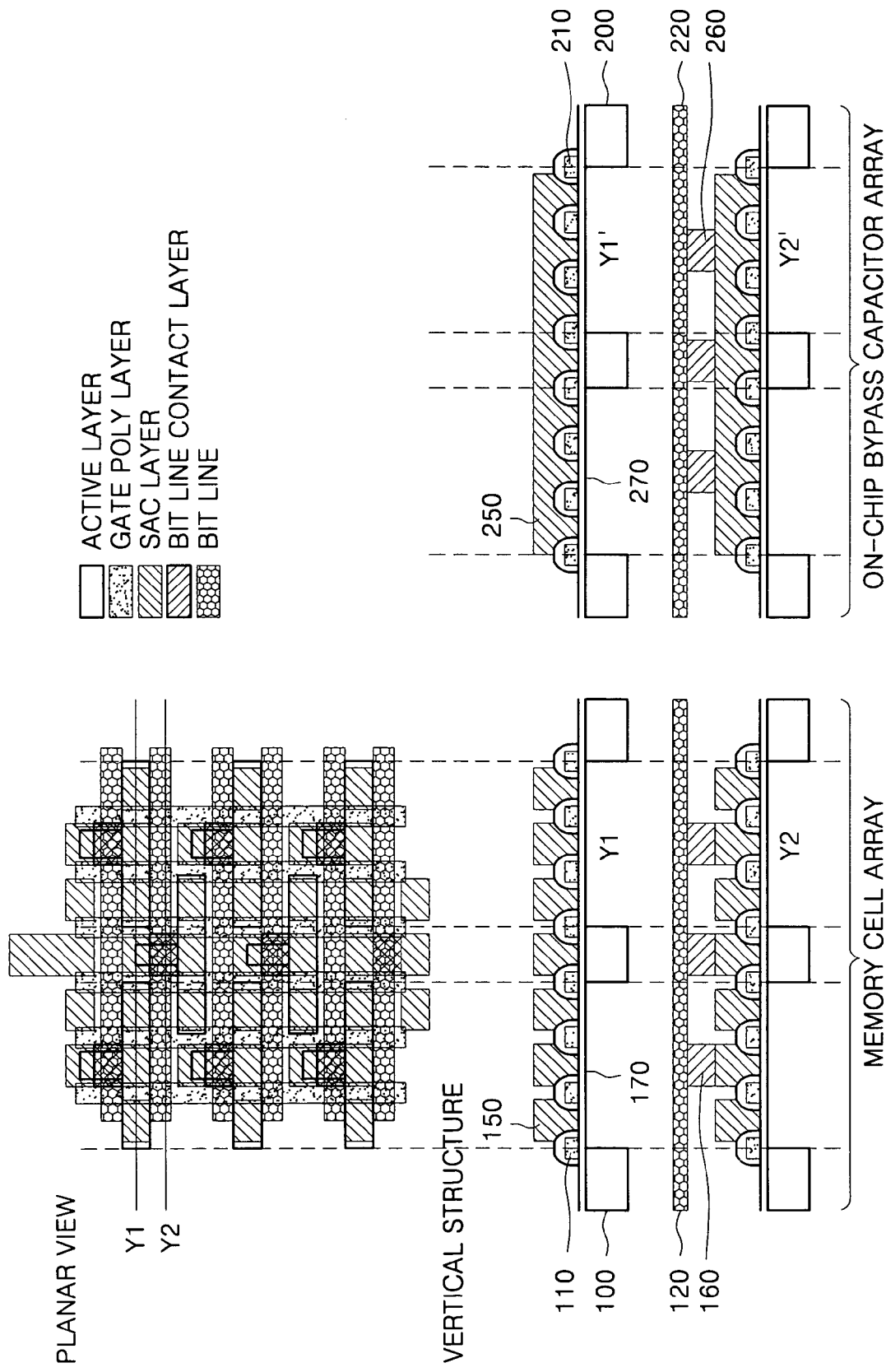

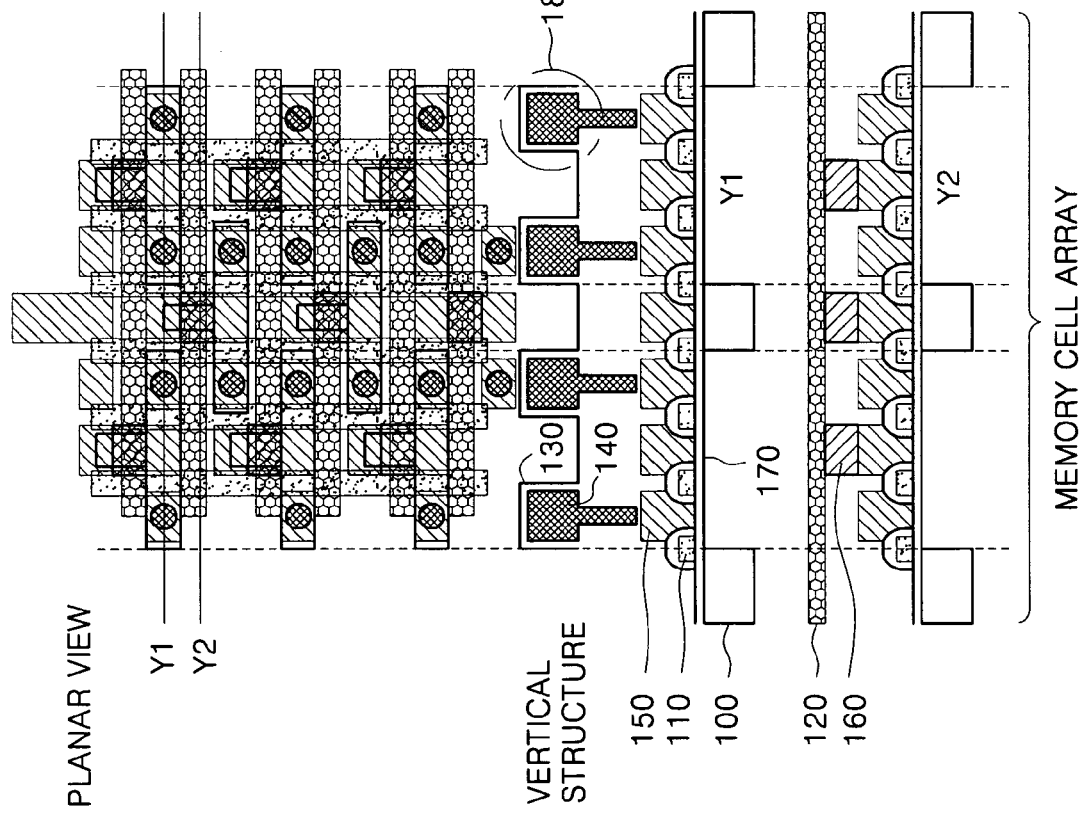

ON-CHIP BYPASS CAPACITOR AND METHOD OF MANUFACTURING THE SAME

CROSS-REFERENCE TO RELATED APPLICATIONS

This application claims the benefit under 35 U.S.C. § 119(a) of Korean Patent Application No. 2003-0066397, filed on Sep. 23, 2003, the contents of which are hereby incorporated by reference in their entirety

BACKGROUND OF THE INVENTION

1. Field of the Invention

The present invention relates to an on-chip bypass capacitor and methods of manufacturing the same.

2. Description of the Related Art

FIG. 1 illustrates a simplified diagram of a power supply network 10. The power supply network 10 may have parasitic elements, including resistive, on-chip, parasitic elements and inductive, off-chip, parasitic elements. Further, a current drawn across these elements may induce a noise voltage represented by:

$Ri + L\,di/dt$

In the power supply network 10 of FIG. 1, a 10 watt chip may draw 4 amps at 2.5 volts (DC current), but may have a peak current of 10–20 amps.

A difference between the peak and average current may be supplied by a local on-chip bypass capacitor or a decoupling capacitor to filter noise. The different between the peak current and the average current is illustrated in FIG. 2.

Conventional processes may form an on-chip bypass capacitor during the same fabrication process as is used to form corresponding cell capacitors. The voltage across a cell capacitor of a memory cell may be represented by $(VINT-VSS)/2$.

However, the voltage difference across an on-chip bypass capacitor may be represented by VINT/VSS, which may cause the oxide of the on-chip capacitor to break down more rapidly than an oxide of the cell capacitor.

SUMMARY OF THE INVENTION

Exemplary embodiments of the present invention are directed to an on-chip bypass capacitor including at least two on-chip bypass capacitor arrays connected in series.

Exemplary embodiments of the present invention are directed to a chip including a memory cell array and an on-chip bypass capacitor including at least two on-chip bypass capacitor arrays connected in series.

Exemplary embodiments of the present invention are directed to an on-chip bypass capacitor array including at least one capacitor connected in parallel.

Exemplary embodiments of the present invention may permit the on-chip bypass capacitor arrays to be formed at the same time, using the same processing steps, as the memory cell array.

Exemplary embodiments of the present invention may permit a voltage applied across each on-chip bypass capacitor array in series to be decreased and/or substantially equal to a voltage applied across the memory cell array, to reduce deterioration of an oxide layer of the on-chip bypass capacitor array.

Exemplary embodiments of the present invention are directed to an on-chip bypass capacitor including at least two on-chip bypass capacitor arrays connected in series by a first layer, such as a common wire.

Exemplary embodiments of the present invention are directed to an on-chip bypass capacitor array including at least one capacitor connected in parallel by a second layer, such as a bit line.

Exemplary embodiments of the present invention are directed to a chip where at least two on-chip bypass capacitor arrays are connected in series and capacitors of each on-chip bypass capacitor array are connected in parallel using a single layer. The single layer may be a common wire and/or a bit line.

Exemplary embodiments of the present invention are directed to an on-chip bypass capacitor including on-chip bypass capacitor arrays formed next to, above, or below the memory cell array.

Exemplary embodiments of the present invention are directed to an chip including an on-chip bypass capacitor and a memory cell array where the memory cell array may be made up of MOS capacitors and/or stacked capacitors.

Stacking the on-chip bypass capacitor arrays above or below the memory cell array may be particularly advantageous when a single layer is utilized to connect the on-chip bypass capacitor arrays in series and the capacitors of each on-chip bypass capacitor array in parallel and the memory cell array includes MOS capacitors Exemplary embodiments of the present invention may be used in any type of memory, for example a DRAM memory.

Exemplary embodiments of the present invention are directed to methods of manufacturing the above exemplary embodiments.

BRIEF DESCRIPTION OF THE DRAWINGS

Exemplary embodiments of the present invention will become more fully understood from the detailed description given below and the accompanying drawings, which are given for purposes of illustration only, and thus do not limit the invention.

FIG. 4a illustrates forming an active region with an active photo-mask according to an exemplary embodiment of the present invention.

FIG. 4b illustrates the formation of word lines using a gate poly photomask according to an exemplary embodiment of the present invention.

FIG. 4c illustrates forming self-aligned contact (SAC) pads using a SAC photomask according to an exemplary embodiment of the present invention.

FIG. 4e illustrates forming bit line using a bit line photomask according to an exemplary embodiment of the present invention.

FIG. 4f illustrates forming cells according to an exemplary embodiment of the present invention.

It should be noted that these Figures are intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

DETAILED DESCRIPTION OF EXEMPLARY EMBODIMENTS OF THE PRESENT INVENTION

Figure 1:
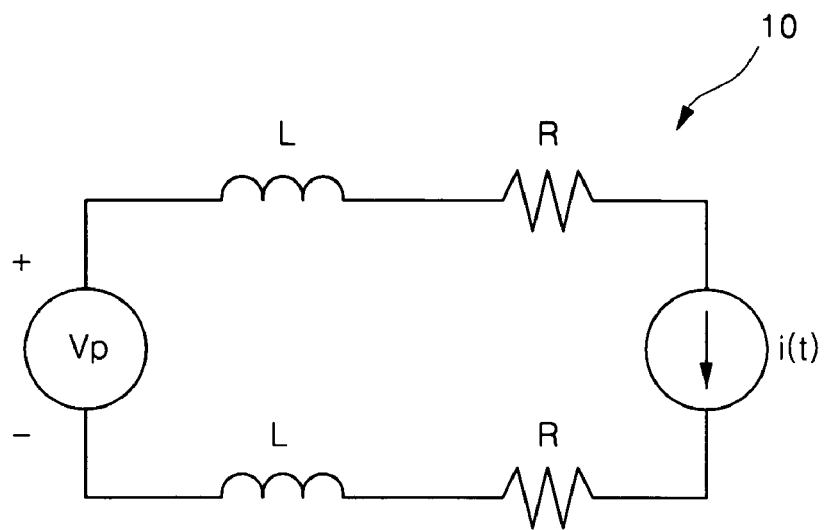
FIG. 1 illustrates a simplified, conventional power supply network.
Figure 2:
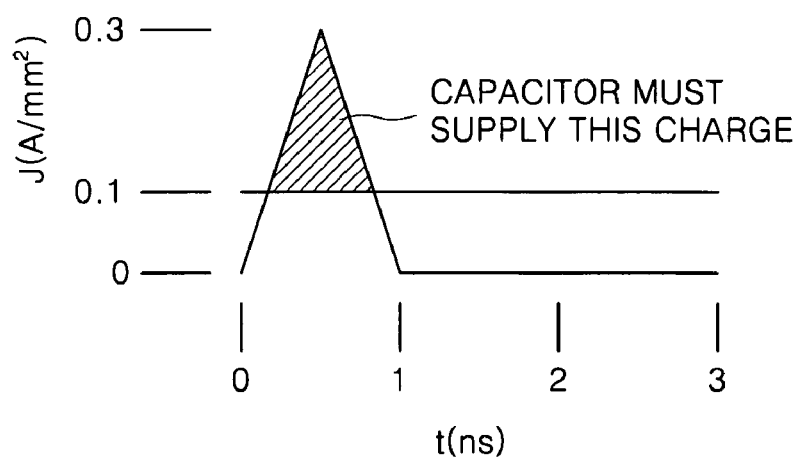
FIG. 2 difference between a peak and average current which may be supplied by a conventional local on-chip bypass capacitor or decoupling capacitor.
Figure 3A:
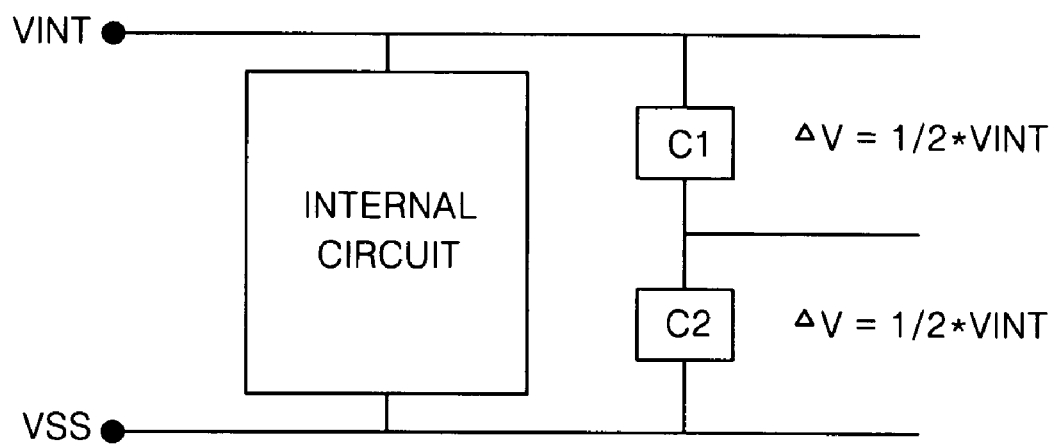
FIG. 3a illustrates a chip according to an exemplary embodiment of the present invention.

As illustrated in FIG. 3a, a chip according to an exemplary embodiment of the present invention may include an internal circuit (or memory cell array capacitor) and an on-chip capacitor in parallel with the internal circuit, the on-chip capacitor including at least two capacitor arrays C1, C2, which are arranged in series. The total capacitance of the on-chip capacitor illustrated in FIG. 3a is:

$$C_{total}=(C1*C2)/(C1+C2);$$

and the voltage across each of the capacitor arrays C1 and C2 is:

$$\Delta V = \tfrac{1}{2} * VINT.$$

Although FIG. 3a illustrates two capacitor arrays C1 and C2 in series, any number of capacitor arrays greater than two could also be utilized, as would be recognized by one of ordinary skill in the art.

Figure 3B:
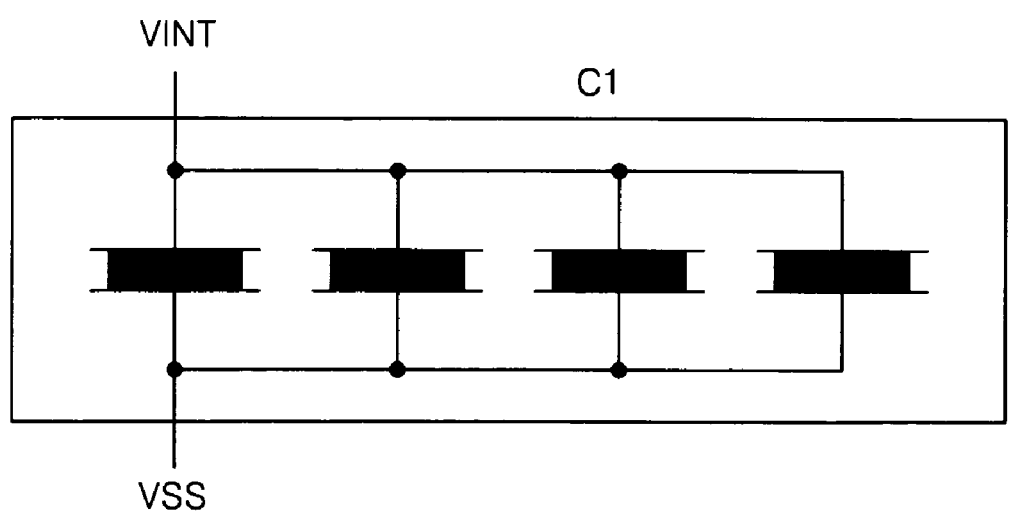
FIG. 3b illustrates a capacitor array according to an exemplary embodiment of the present invention.

As illustrated in FIG. 3b, each capacitor array C1 and C2 may include one or more capacitors in parallel. FIG. 3b illustrates four capacitors in parallel, but any other number, greater than or equal to one could be arranged in parallel with the internal circuit, as would be recognized by one of ordinary scale in the art.

As illustrated in FIGS. 3a and 3b, the on-chip bypass capacitor according to exemplary embodiments of the present invention may be formed using the same process steps used for the internal circuit (or memory cell array capacitor), may be as large as possible due to the parallel arrangement of the capacitors of the on-chip bypass capacitor arrays, and/or produce a smaller electric field between oxide layers to improve reliability, due to the series arrangement of the on-chip bypass capacitor arrays.

Figure 4D:
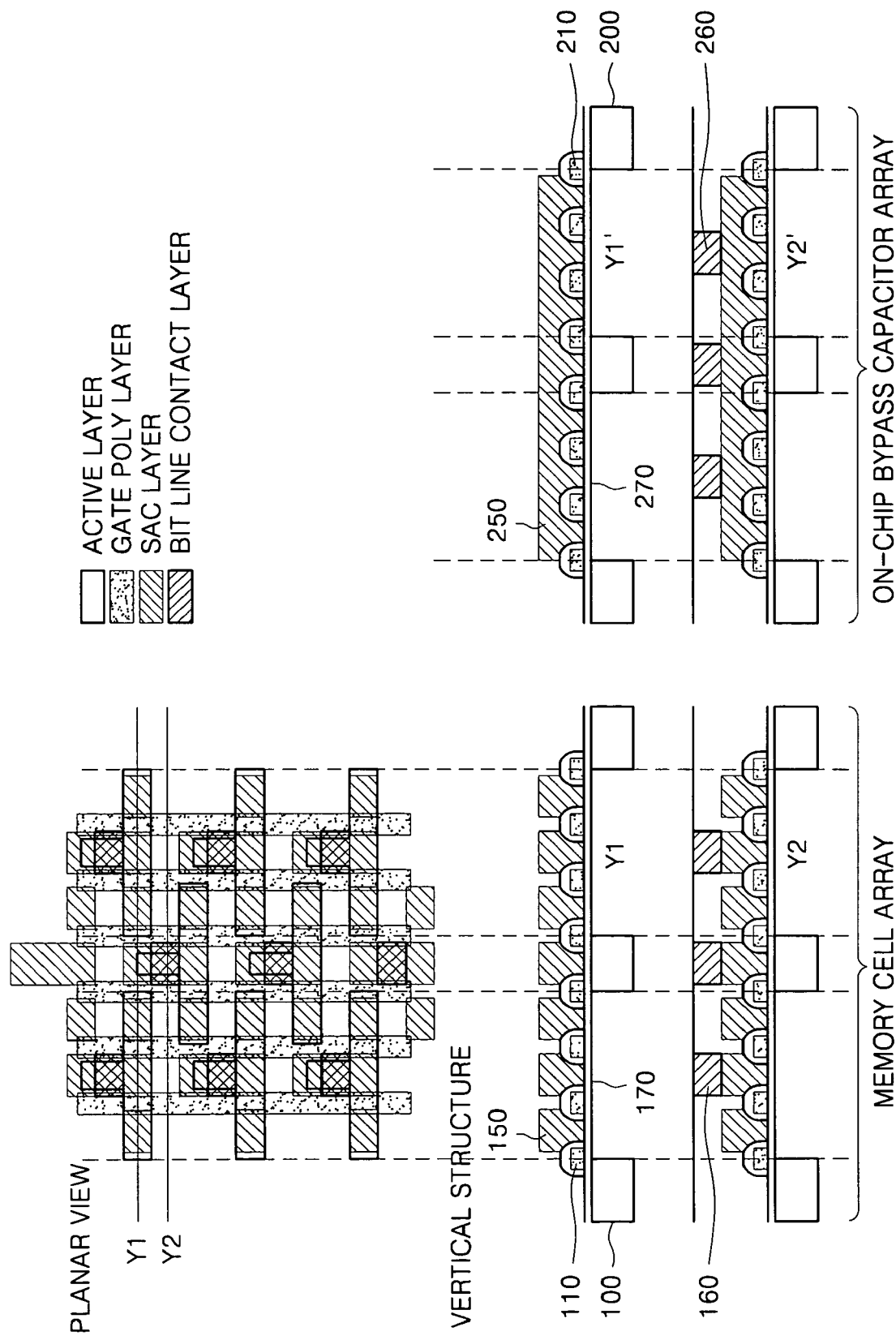
FIG. 4d illustrates forming bit line contacts using a bit line contact photomask according to an exemplary embodiment of the present invention.

FIGS. 4a–4f illustrate a process for manufacturing on-chip bypass capacitor on a chip with at least one cell capacitor, in accordance with an exemplary embodiment of the present invention. FIG. 4a illustrates forming an active region with an active photomask, in accordance with an exemplary embodiment of the present invention. The active photomask includes a portion for both the cell array and the on-chip bypass capacitor array so that both may be formed simultaneously. As shown, FIG. 4a illustrates a planar view, as well as, a vertical structure of both the memory cell array and the on-chip bypass capacitor array. As shown in FIG. 4a, active regions 170 are formed between isolation areas 100 in the memory cell array and dummy active regions 270 are formed between dummy isolation layers 200 in the on-chip bypass capacitor array. Both the planar view and the vertical structure illustrate views from both a Y1 and Y2 direction. The planar view of FIG. 4a illustrates the active regions 170.

FIG. 4b illustrates the formation of word lines using a gate poly photomask according to an exemplary embodiment of the present invention. FIG. 4b illustrates a planar view and a vertical structure, which illustrates the gate poly layers. As shown in the vertical structure, a word line 110 is patterned to form a transistor in the memory cell array and a dummy pattern 210 (which may be omitted) is patterned in the on-chip bypass capacitor array. Both the planar view and the vertical structure illustrate views from both the Y1 and Y2 direction. The planar view of FIG. 4b illustrates the word lines 110 in relation to the active regions 170.

FIG. 4c illustrates forming self-aligned contact (SAC) pads using a SAC photomask according to an exemplary embodiment of the present invention. FIG. 4c illustrates a planar view and a vertical structure of the memory cell array and on-chip bypass capacitor array. As shown in the vertical structure portion, a self-aligned contact pad 150 is formed in the memory cell array and a self-aligned contact pad 250 is formed in the on-chip bypass capacitor array. As can be seen in the vertical structure portion of FIG. 4c, the self-aligned contact pads 150 in the memory cell array are patterned, whereas the self-aligned contact pads 250 in the on-chip bypass capacitor array are not. Both the planar view and the vertical structure illustrate views from both a Y1 and Y2 direction. The planar view of FIG. 4c illustrates the self-aligned contact pads 150 in relation to the word lines 110 and the active regions 170 in the memory cell array and illustrates the self-aligned contact pads 250 in the on-chip bypass capacitor array.

FIG. 4d illustrates forming bit line contacts using a bit line contact photomask according to an exemplary embodiment of the present invention. FIG. 4d illustrates a planar view and a vertical structure of the memory cell array and on-chip bypass capacitor array. As shown in the vertical structure portion, a bit contact line 160 (in the exemplary embodiment illustrated in FIG. 4d at Y2 only, and not Y1) is formed in the memory cell array and a bit line contact 260 is formed (in the exemplary embodiment of FIG. 4d, also only at Y2) in the on-chip bypass capacitor array. The planar view of FIG. 4d illustrates the bit contact line 160 in relation to the self-aligned contact pads 150, the word lines 1 10 and the active regions 170 in the memory cell array FIG. 4e illustrates forming bit line using a bit line photomask according to an exemplary embodiment of the present invention. FIG. 4e illustrates a planar view and a vertical structure of the memory cell array and on-chip bypass capacitor array. As shown in the vertical structure portion, a bit-line on 120 (in the exemplary embodiment illustrated in FIG. 4e at Y2 only, and not Y1) is formed in the memory cell array and a common wire 220 (in the exemplary embodiment illustrated in FIG. 4e, also only at Y2), which may act as a series connection, is formed in the on-chip bypass capacitor array.

FIG. 4f illustrates forming cells according to an exemplary embodiment of the present invention. FIG. 4f illustrates a planar view and a vertical structure of the memory cell array and on-chip bypass capacitor array. As shown in the vertical structure portion, storage cell capacitors 180 are formed (in the exemplary embodiment illustrated in FIG. 4f at Y1 only, and not Y2) in the memory cell array and bypass capacitors 280 are formed (in the exemplary embodiment illustrated in FIG. 4f, also only at Y1) in the on-chip bypass capacitor array. The electrodes (130, 140, 230 and 240) of the capacitors in the memory cell and on-chip bypass capacitor array are formed simultaneously and a dielectric layer between them are formed.

Figure 5:
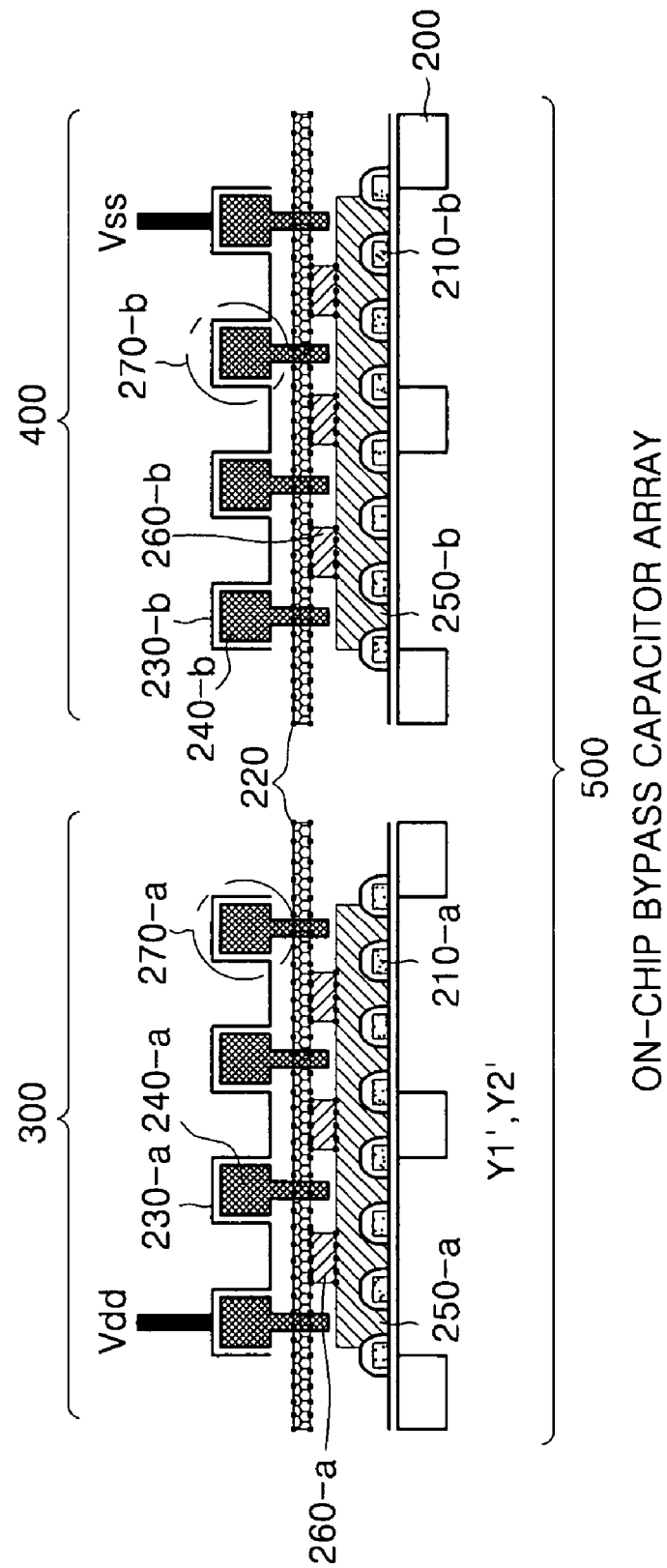
FIG. 5 illustrates two on-chip bypass capacitor arrays formed by the exemplary method shown in FIGS. 4a–4f.

FIGS. 5 illustrate on-chip bypass capacitor formed by the exemplary method shown in FIGS. 4a–4f.

FIG. 5 illustrates a first on-chip bypass capacitor array 300 (or C1 as shown in FIG. 3a) and a second on-chip bypass capacitor array 400 (or C2 as shown in FIG. 3b) and a common wire 220 in accordance with an exemplary embodiment of the present invention. As shown in FIG. 5, the first on-chip bypass capacitor array 300 (or C1) is connected in series with the second on-chip bypass capacitor array 400 (or C2).

As shown in FIG. 5, the first on-chip bypass capacitor array 300 (or C1 as shown in FIG. 3a may include a dummy isolation layer 200, dummy word lines 210-a, a common wire 220, a first electrode 230-a, a second electrode 240-a, a first self-aligned contact pad 250-a, via contacts 260-a, and cell capacitors 270-a (to one of which a voltage, such as VDD or VINT, may be applied as shown In FIGS. 3a and 3b). In an exemplary embodiment, the first electrode 230-a and the second electrode 240-a may be formed from doped polysilicon.

As shown in FIG. 5, a second on-chip bypass capacitor array 400 (or C2 as shown in FIG. 3b) may include a dummy isolation layer 200, dummy word lines 210-b, the common wire 220, a third electrode 230-b, a fourth electrode 240-b, a second self-aligned contact pad 250-b, via contacts 260-b, and cell capacitors 270-b (to one of which a voltage, such as VSS, may be applied as shown In FIGS. 3a and 3b). In an exemplary embodiment, the third electrode 230-b and the fourth electrode 240-b may be formed from doped polysilicon.

As shown in FIG. 5, although the SAC pads 150 are patterned in the memory cell array, in the on-chip bypass capacitor arrays 300, 400, the SAC pads 250a and 250-b are not patterned in the direction of Y1 to provide electrical connection between a plurality of via contacts 260-a and 260-b and a plurality of the third electrodes 240-a and 240-b. The SAC pad 250-a is connected to the SAC pad 250-b through the common wire 220 and via contact 260. As discussed above, the common wire 220 may be a bit line 120 in the memory cell array.

As shown in FIG. 5, each of the first on-chip bypass capacitor arrays 300, 400 may include more than one capacitor 270-a and 270-b in parallel. As shown in FIG. 5, all the second electrodes 240-a of the first on-chip bypass capacitor array 300 are connected to the SAC pad 250-a, so that each capacitor 270-a of the first on-chip bypass capacitor array 300 is connected in parallel with each other. Similarly, all the fourth electrodes 240-b of the second on-chip bypass capacitor array 400 are connected to the SAC pad 250-b, so that each capacitor 270-b of the second on-chip bypass capacitor array 400 is connected in parallel with each other.

Figure 6:
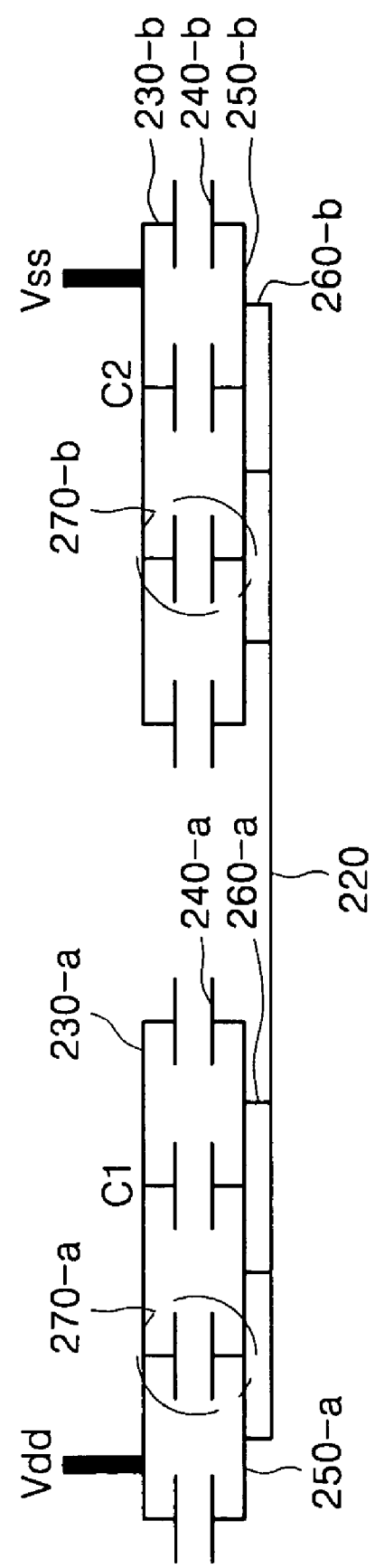
FIG. 6 illustrates a circuit equivalent of the vertical structure of the on-chip bypass capacitor of FIG. 5.

FIG. 6 illustrates a circuit equivalent of the vertical structure of the on-chip bypass capacitor of FIG. 5. The numerals of FIG.6 indicates the same numerals of FIG. 5. For example, the electrical line 220 is for the common wire 220 of FIG. 5. The electrical wire 260-a and 260-b is for the Via contact 260-a and 260-b of FIG. 5.

As shown in FIG. 6, the equivalent circuit includes a first on-chip bypass capacitor array 300 (or C1) and a second on-chip bypass capacitor array 400 (or C2) connected in series so that the total capacitance is C1*C2/(C1+C2). The series connection may be formed by the common wire 220. The capacitance C1 of the first on-chip bypass capacitor array 300 may be made up of a parallel connection of a plurality of capacitors 270-a. Similarly, the capacitance C2 of the second on-chip bypass capacitor array 400 may be made up of a parallel connection of a plurality of cell capacitors 270-b.

Although exemplary embodiments of the present invention have described two on-chip bypass capacitor arrays, any number of on-chip bypass capacitor arrays, greater than two could also be utilized, as would be recognized by one of ordinary skill in the art. Although exemplary embodiments of the present invention have described each on-chip bypass capacitor array as including four capacitors, any number of capacitors, one or greater could also be utilized, as would be recognized by one of ordinary skill in the art. Further, the number of capacitors in each on-chip bypass capacitor arrays could be different, as would be recognized by one of ordinary skill in the art.

Although exemplary embodiments of the present invention describe on-chip bypass capacitor arrays connected in series by a common wire, any other layer could be utilized to connect the on-chip bypass capacitor arrays, as would be recognized by one of ordinary skill in the art.

Similarly, although exemplary embodiments of the present invention describe capacitors of each on-chip bypass capacitor array connected in parallel by a bit line, any other layer could be utilized to connect the capacitors of each on-chip bypass capacitor array in parallel, as would be recognized by one of ordinary skill in the art.

Although exemplary embodiments of the present invention describe on-chip bypass capacitor arrays connected in series by a common wire and capacitors of each on-chip bypass capacitor array connected in parallel by a bit line, a single layer could be utilized to connect the on-chip bypass capacitor arrays in series and the capacitors of each on-chip bypass capacitor array in parallel, as would be recognized by one of ordinary skill in the art.

Although exemplary embodiments of the present invention describe forming on-chip bypass capacitor arrays next to a memory cell array, the on-chip bypass capacitor arrays could be stacked above or below the memory cell array, as would be recognized by one of ordinary skill in the art.

Although exemplary embodiments of the present invention describe the memory cell array generically, the memory cell array could be made up of MOS capacitors and/or stacked capacitors, as would be recognized by one of ordinary skill in the art. Stacking the on-chip bypass capacitor arrays above or below the memory cell array may be particularly advantageous when a single layer is utilized to connect the on-chip bypass capacitor arrays in series and the capacitors of each on-chip bypass capacitor array in parallel and the memory cell array includes MOS capacitors, as would be recognized by one of ordinary skill in the art.

Exemplary embodiments of the present invention may be used in any type of memory, for example a DRAM memory, as would be recognized by one of ordinary skill in the art.

Exemplary embodiments of the present invention may permit the on-chip bypass capacitor arrays to be formed at the same time, using the same processing steps, as the memory cell array, as would be recognized by one of ordinary skill in the art.

Exemplary embodiments of the present invention may permit a voltage applied across each on-chip bypass capacitor array in series to be decreased and/or substantially equal to a voltage applied across a memory cell array, to reduce deterioration of an oxide layer of the on-chip bypass capacitor array, as would be recognized by one of ordinary skill in the art.

Although FIGS. 4a–4f, 5, and 6 illustrate a particular process for generating a particular final structure having a particular equivalent circuit, it is obvious to one of ordinary skill in the art, that the disclosed process may be used to produce other final structures with other, equivalent structures, the disclosed final structure may be produced by other processes, and/or the disclosed equivalent circuit may be produced by other processes and/or correspond to the other final structures.

It will be apparent to those skilled in the art that other changes and modifications may be made in the above-described exemplary embodiments without departing from the scope of the invention herein, and it is intended that all matter contained in the above description shall be interpreted in an illustrative and not a limiting sense.

We claim:

1. A chip comprising:
    a memory cell array including at least one cell capacitor; and
    an on-chip bypass capacitor including at least two capacitor arrays, in parallel with the memory cell array, each capacitor array including a first layer connecting the at least two capacitor arrays in series, each capacitor array including a plurality of capacitors, each of the plurality of capacitors including a second layer connecting the plurality of capacitors in parallel.

2. The chip of claim 1, wherein the second layer is an unpatterned region of a self-aligned contact pad of the at least one cell capacitor.

3. The chip of claim 1, wherein the first layer is a bit line of the at least one cell capacitor which acts as a common wire between each of the at least two capacitor arrays.

4. The chip of claim 1, wherein the first layer and the second layer are the same layer.

5. The chip of claim 4, wherein the layer is a polysilicon layer.

6. The chip of claim 4, wherein the at least one cell capacitor is a MOS capacitor and the on-chip bypass capacitor is formed above the MOS capacitor.

7. The chip of claim 1, wherein the at least one cell capacitor is a stack-type capacitor.

8. The chip of claim 1, wherein the series connection between the at least two capacitor arrays is between the first layer of the at least two capacitor arrays.

9. A chip comprising:
    a memory cell array including at least one cell capacitor; and
    an on-chip bypass capacitor including at least two capacitor arrays, in parallel with the memory cell array, each capacitor array including a layer connecting the at least two capacitor arrays in series, each capacitor array including a plurality of capacitors, the layer further connecting the plurality of capacitors in parallel.

10. The chip of claim 9, wherein the layer is an unpatterned region of a self-aligned contact pad of the at least one cell capacitor and/or a bit line of the at least one cell capacitor which acts as a common wire between each of the plurality of capacitor arrays.

11. The chip of claim 9, wherein the layer is a polysilicon layer.

12. The chip of claim 9, wherein the at least one cell capacitor is a MOS capacitor and the on-chip bypass capacitor is formed above the MOS capacitor.

13. The chip of claim 9, wherein the at least one cell capacitor is a stack-type capacitor.

14. A chip comprising:
    a memory cell array including at least one cell capacitor; and
    a first capacitor including,
        a first electrode,
        a plurality of second electrodes;
        an oxide between the first electrode and the plurality of second electrodes, and
        a first portion of a second layer connecting the plurality of second electrodes;
    a second capacitor including,
        a third electrode,
        a plurality of fourth electrodes,
        an oxide between the third electrode and the plurality of fourth electrodes, and
        a second portion of the second layer connecting the plurality of fourth electrodes; and
    a first layer connecting the first portion of the second layer and the second portion of the second layer.

15. The on-chip bypass capacitor of claim 14, wherein the first electrode of the first capacitor and the second capacitor are connected to a first power source and a second power source, respectively.

16. The on-chip bypass capacitor of claim 14, wherein the first electrode is a plate polysilicon layer of the at least one cell capacitor.

17. The on-chip bypass capacitor of claim 16, wherein the second electrode is a storage polysilicon layer of the at least one cell capacitor.

18. The on chip bypass capacitor of claim 15, wherein the first power source is one of an external VCC, an external VDD and internal DC generators.

19. The on-chip bypass capacitor of claim 14, wherein the second layer is an unpatterned portion of a self-aligned contact pad layer of the at least one cell capacitor.

20. The on-chip bypass capacitor of claim 14, wherein the first layer is a bit line of the at least one cell capacitor which acts as a common wire between the second electrodes of the first and second capacitor.

21. The on-chip bypass capacitor of claim 14, wherein the first layer and the second layer are the same layer.

22. The on-chip bypass capacitor of claim 21, wherein the layer is a polysilicon layer.

23. The on-chip bypass capacitor of claim 21, wherein at least one cell capacitor is a MOS capacitor and the on-chip bypass capacitor is formed above the MOS capacitor.

24. The on-chip bypass capacitor of claim 14, wherein the at least one cell capacitor is a stack-type capacitor.

* * * * *